(12) United States Patent
Lee et al.

(10) Patent No.: US 9,768,411 B2
(45) Date of Patent: Sep. 19, 2017

(54) ORGANIC LIGHT EMITTING DISPLAY APPARATUS AND MANUFACTURING METHOD THEREOF

(71) Applicant: LG Display Co., Ltd., Seoul (KR)

(72) Inventors: Jae-Young Lee, Gyeonggi-do (KR); Joon-Won Park, Seoul (KR); Sang-Heun Lee, Seoul (KR); Hae-Ri Huh, Gyeonggi-do (KR); Hun-Hoe Heo, Daejeon (KR); Ji-Min Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/522,737

(22) Filed: Oct. 24, 2014

(65) Prior Publication Data

US 2015/0155344 A1 Jun. 4, 2015

(30) Foreign Application Priority Data

Nov. 29, 2013 (KR) .................. 10-2013-0147436

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3244* (2013.01); *H01L 51/524* (2013.01); *H01L 51/0097* (2013.01); *H01L 2227/323* (2013.01)

(58) Field of Classification Search
CPC ........... H01L 27/3258; H01L 2227/323; H01L 51/5246; H01L 51/5253; H01L 51/56
See application file for complete search history.

(56) References Cited

U.S. PATENT DOCUMENTS

2004/0241353 A1* 12/2004 Odamura et al. .......... 428/32.51
2005/0127371 A1 6/2005 Yamazaki et al.
(Continued)

FOREIGN PATENT DOCUMENTS

WO 2013146583 A1 10/2013

OTHER PUBLICATIONS

First Notification of Office Action dated Apr. 13, 2017 by The State Intellectual Property Office of China in counterpart Chinese application No. 201410387820.0. Note: U.S. 2011/0198638 cited therein is already of record.

*Primary Examiner* — Charles Garber
*Assistant Examiner* — Brigitte Paterson
(74) *Attorney, Agent, or Firm* — Morgan, Lewis & Bockius LLP

(57) ABSTRACT

Provided are an organic light emitting display (OLED) apparatus and a manufacturing method thereof. The OLED apparatus includes: a thin film transistor (TFT) array substrate including: a support substrate, including a soft material and a plurality of TFTs on the support substrate corresponding to a plurality of pixel areas, a light emitting array (LEA) including a plurality of organic light emitting devices on the TFT array substrate corresponding to the plurality of pixel areas, a sealing structure facing the TFT array substrate, the LEA interposed between the TFT array substrate and the sealing structure, and an adhesive layer between the LEA and the sealing structure to adhere the LEA to the sealing structure, wherein the sealing structure includes: a protective layer on the LEA, a sealing layer over the TFT array substrate, and a barrier layer adhering the protective layer to the sealing layer.

19 Claims, 19 Drawing Sheets

(56) References Cited

U.S. PATENT DOCUMENTS

| | | |
|---|---|---|
| 2008/0062359 A1 | 3/2008 | Inaba et al. |
| 2009/0115321 A1* | 5/2009 | Hayashi ..................... 313/504 |
| 2011/0198638 A1* | 8/2011 | Wang ..................... H01L 33/64 |
| | | 257/98 |
| 2013/0049580 A1* | 2/2013 | Maindron et al. ............ 313/512 |
| 2013/0248891 A1 | 9/2013 | Kim et al. |
| 2013/0334511 A1* | 12/2013 | Savas ..................... H01L 51/56 |
| | | 257/40 |
| 2014/0159026 A1* | 6/2014 | Okumoto ............. H01L 29/786 |
| | | 257/40 |
| 2014/0175397 A1* | 6/2014 | Lee ..................... H01L 51/5253 |
| | | 257/40 |
| 2014/0319474 A1* | 10/2014 | Kim ................... H01L 51/5256 |
| | | 257/40 |
| 2015/0076464 A1* | 3/2015 | Sakaguchi ............. H05B 33/04 |
| | | 257/40 |

* cited by examiner

ORGANIC LIGHT EMITTING DISPLAY APPARATUS AND MANUFACTURING METHOD THEREOF

CROSS-REFERENCE TO RELATED APPLICATION(S)

The present application claims benefit and priority under 35 U.S.C. §119(a) of Korean Patent Application No. 10-2013-0147436, filed on Nov. 29, 2013, the entire disclosure of which is hereby incorporated by reference herein for all purposes.

BACKGROUND

1. Technical Field

The following description relates to an organic light emitting display apparatus usable as a flexible display apparatus and a manufacturing method thereof.

2. Discussion of the Related Art

Recent transition into an information-oriented society has caused rapid development in the field of displays to visually represent electrical information signals, and correspondingly a variety of flat panel display apparatuses exhibiting excellent properties, such as a thin profile, light weight, and low power consumption, have been developed.

Representative examples of these flat panel display apparatuses may include Liquid Crystal Display (LCD), Plasma Display Panel (PDP), Field Emission Display (FED), Electro Luminescence Display (ELD), Electro-Wetting Display (EWD), and organic light emitting display apparatuses.

All of the aforementioned flat panel display apparatuses essentially include a flat display panel to display an image. The flat display panel is fabricated by bonding a pair of substrates to face each other with an inherent light emitting material or a polarizer interposed therebetween. The flat panel display includes a display face defined by a display region and a peripheral non-display region around the display region. The display region is defined by a plurality of pixel areas.

Recently, one kind of flat panel display apparatus, flexible display apparatuses, have been developed, which include a flexible substrate formed of a soft material, thus being capable of maintaining display performance when being bendable like a sheet of paper.

Such flexible display apparatuses may have a broader application range than conventional display apparatuses having no flexibility, and therefore research and development on commercialization of flexible display apparatuses is underway.

Meanwhile, organic light emitting display apparatuses are configured to display an image using self-illuminating organic light emitting devices. That is, the organic light emitting display apparatuses include a plurality of organic light emitting devices corresponding to a plurality of pixel areas.

Typically, such an organic light emitting device includes first and second electrodes arranged to face each other, and an emission layer between the first and second electrodes, the emission layer being formed of an organic material to attain electro-luminescence based on drive current between the first and second electrodes.

The organic emission layer, however, may be easily and rapidly deteriorated due to water, oxygen, and the like. Thus, typical organic light emitting display apparatuses include a sealing structure to prevent invasion of water and oxygen into the organic layer.

FIG. 1 is a partial sectional view of a typical organic light emitting display apparatus.

As shown in FIG. 1, the typical organic light emitting display apparatus 10 includes a thin film transistor array substrate 11, a light emitting array 12 on the thin film transistor array substrate 11, and a sealing structure 13 bonded to the thin film transistor array substrate 11. The thin film transistor array substrate 11 and the sealing structure 13 face each other, with the emitting array 12 interposed therebetween.

The sealing structure 13 includes a sealing layer 13a bonded to face the thin film transistor array substrate 11, a protective layer 13b disposed to cover the top of the light emitting array 12, and a barrier layer 13c disposed between the sealing layer 13a and the protective layer 13b, such that the sealing layer 13a and the protective layer 13b are adhered to each other by the barrier layer 13c.

The protective layer 13b is a stack of multiple layers formed of organic and inorganic insulating materials having different components or thicknesses. That is, the protective layer 13b includes at least one insulator layer formed of an inorganic insulating material.

However, a thin film formed of an inorganic insulating material tends to transfer the contour of any object thereon. Although a thick film may be contemplated to prevent this problem, this requires disadvantageously high costs and long process time. However, to compensate for impurities on the light emitting array 12, the protective layer 13b, which is disposed on the light emitting array 12, essentially includes an insulator layer formed of an organic insulating material. Formation of a thick organic insulator layer is easier than formation of a thick inorganic insulator layer. This addition of the organic insulator layer, however, is disadvantageous for reduction in the thickness of the display apparatus.

Moreover, the insulator layer formed of an inorganic insulating material is more vulnerable to bending stress than that formed of an organic insulating material. Therefore, the protective layer 13b may easily crack when the flexible display apparatus bends, thus causing generation of impurities.

In addition, because the protective layer 13b and the light emitting array 12 are formed of different materials, separation of the protective layer 13b and the light emitting array 12 may easily occur when the flexible display apparatus is bent.

The cracking, generation of impurities, and separation described above may provide invasion routes for water and oxygen to the light emitting array 12, thus resulting in deterioration in the lifespan and reliability of the apparatus.

SUMMARY OF THE INVENTION

Accordingly, embodiments of the present application are directed to an organic light emitting display apparatus and a manufacturing method thereof that substantially obviate one or more problems due to the limitations and disadvantages of the related art.

An object of embodiments is to provide an organic light emitting display apparatus to prevent deterioration of lifespan and reliability caused by bending, thus advantageously serving as a flexible display apparatus, and a manufacturing method thereof.

Advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose according to one aspect of the invention, there is provided an organic light emitting display apparatus, including: a thin film transistor array substrate including: a support substrate, including a soft material and a plurality of thin film transistors on the support substrate and corresponding to a plurality of pixel areas, a light emitting array including a plurality of organic light emitting devices on the thin film transistor array substrate and corresponding to the plurality of pixel areas, a sealing structure over the thin film transistor array substrate, such that the light emitting array is interposed between the thin film transistor array substrate and the sealing structure, and an adhesive layer between the light emitting array and the sealing structure, such that the light emitting array and the sealing structure are adhered to each other by the adhesive layer, wherein the sealing structure includes: a protective layer on the light emitting array, a sealing layer over the thin film transistor array substrate, and a barrier layer adhering the protective layer and the sealing layer to each other.

In another aspect, there is provided a manufacturing method of an organic light emitting display apparatus, the method including: providing a thin film transistor array substrate and a light emitting array, the thin film transistor array substrate including a support substrate, including a soft material and a plurality of thin film transistors on the support substrate and corresponding to a plurality of pixel areas, and the light emitting array including a plurality of organic light emitting devices on the thin film transistor array substrate and corresponding to the plurality of pixel areas, providing an adhesive layer to the top of the light emitting array, the adhesive layer including transparent properties, both surfaces of the adhesive layer being adhesive surfaces, providing a protective layer on the adhesive layer, the protective layer including a first insulator layer including aluminum oxide, aligning a sealing layer on the protective layer to face the thin film transistor array substrate, and attaching the sealing layer to the thin film transistor array substrate using a barrier layer between the sealing layer and the protective layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
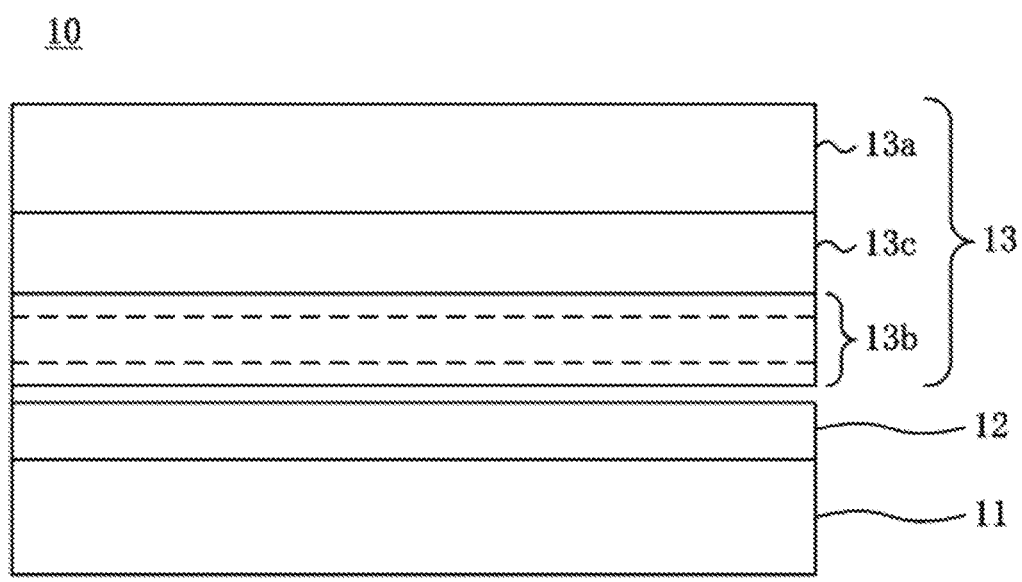
FIG. 1 is a partial sectional view showing a typical organic light emitting display apparatus.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, embodiments will be described in detail with reference to the accompanying drawings.

An organic light emitting display apparatus according to an embodiment will be described with reference to FIGS. 2 to 5.

Figure 2:
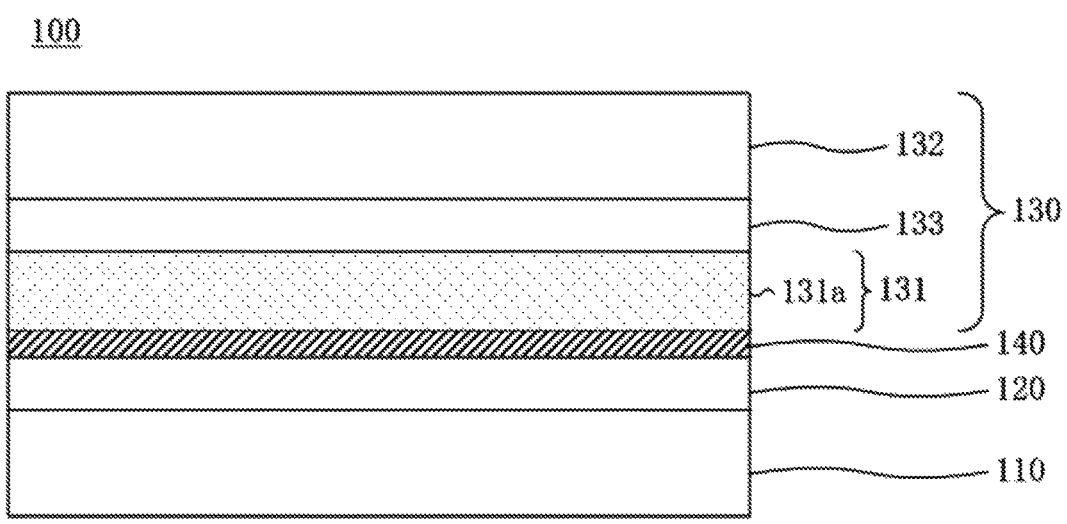
FIG. 2 is a partial sectional view showing an organic light emitting display apparatus according to an embodiment.
Figure 4:
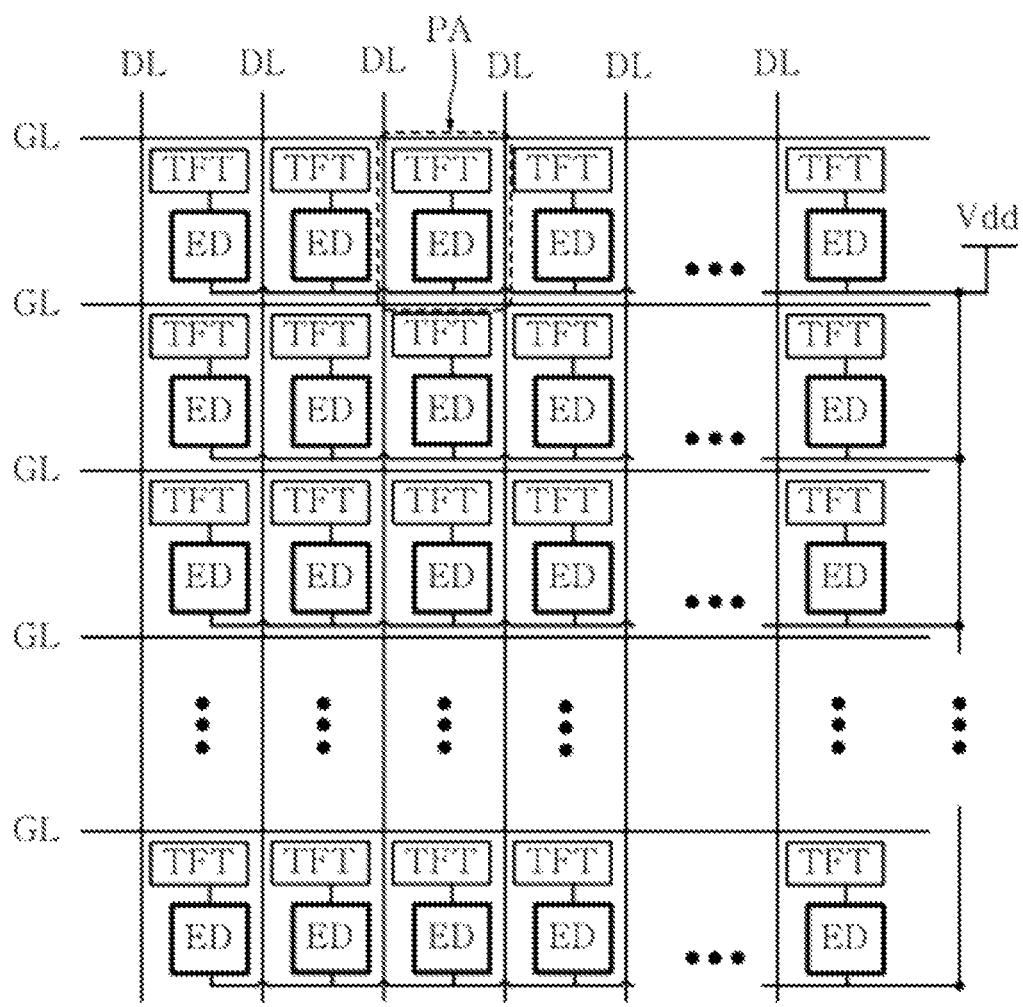
FIG. 4 is a circuit diagram showing the thin film transistor array substrate and the light emitting array of FIG. 2.
Figure 5:
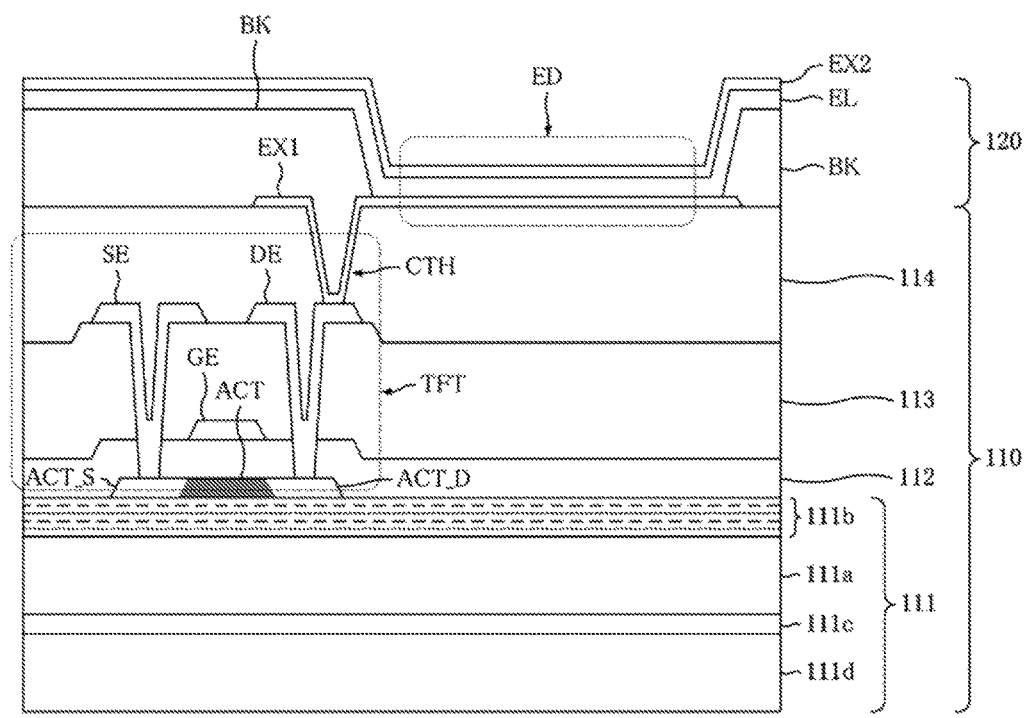
FIG. 5 is a sectional view showing an example of the thin film transistor array substrate and the light emitting array in each pixel area.

FIG. 2 is a partial sectional view showing an organic light emitting display apparatus according to an embodiment. FIGS. 3A to 3E are graphs showing variation of characteristics depending on the thickness of a first insulator layer formed of an aluminum oxide based material. FIG. 4 is a circuit diagram showing the thin film transistor array substrate and the light emitting array of FIG. 2. FIG. 5 is a sectional view showing an example of the thin film transistor array substrate and the light emitting array in each pixel area.

As shown in the example of FIG. 2, the organic light emitting display apparatus 100 according to an embodiment may include a thin film transistor array substrate 110, a light emitting array 120, a sealing structure 130, and an adhesive layer 140. The thin film transistor array substrate 110 may include a support substrate formed of a soft material and a plurality of thin film transistors formed on the support substrate and corresponding to a plurality of pixel areas. The light emitting array 120 may be formed on the thin film transistor array substrate 110, may include a plurality of organic light emitting devices corresponding to the plurality of pixel areas. The sealing structure 130 may be formed to face the thin film transistor array substrate 110, such that the light emitting array 120 may be interposed between the thin film transistor array substrate 110 and the sealing structure 130. Also, the adhesive layer 140 may be formed between the light emitting array 120 and the sealing structure 130, such that the light emitting array 120 and the sealing structure 130 may be adhered to each other by the adhesive layer 140.

The thin film transistor array substrate 110 and the light emitting array 120 will be described below in detail with reference to FIGS. 4 and 5.

The sealing structure 130 may include a protective layer 131 formed on the light emitting array 120, a sealing layer 132 bonded to face the thin film transistor array substrate 110, and a barrier layer 133 adhering the protective layer 131 and the sealing layer 132 to each other. The protective layer 131 may include a first insulator layer 131a formed, e.g., of an aluminum oxide ($AlO_x$) based material. In one example, the aluminum oxide based first insulator layer 131a may have a thickness in a range of 20 nm to 50 nm. Examples of variation of characteristics depending on the thickness of the first insulator layer 131a are illustrated in the following Table 1 and Table 2, and FIGS. 3A to 3E.

TABLE 1

| | Unit performance depending on thickness of aluminum oxide ($AlO_x$) first insulator layer | | | |
|---|---|---|---|---|
| | 10 nm | 20 nm | 30 nm | 40 nm |
| WVTR ($g/m^2$-day) | 0.0136 | 0.0078 | 0.0072 | 0.0064 |
| Density ($g/m^3$) | 2.85 | 2.91 | 2.91 | 2.92 |
| RI (Refractive Index) | 1.62 | 1.63 | 1.63 | 1.63 |
| Stress (MPa) | 50 | 87 | 100 | 106 |
| Step Coverage (%) | 95 | 98 | 98 | 98 |

TABLE 2

| | Unit performance depending on thickness of aluminum oxide ($AlO_x$) first insulator layer | | | |
|---|---|---|---|---|
| | 50 nm | 70 nm | 90 nm | 100 nm |
| WVTR ($g/m^2$-day) | 0.0062 | 0.0083 | 0.0185 | 0.098 |
| Density ($g/m^3$) | 2.93 | 2.90 | 2.84 | 2.82 |
| RI (Refractive Index) | 1.64 | 1.62 | 1.62 | 1.61 |
| Stress (MPa) | 108 | 167 | 248 | 280 |
| Step Coverage (%) | 100 | 100 | 96 | 95 |

Figure 3A:
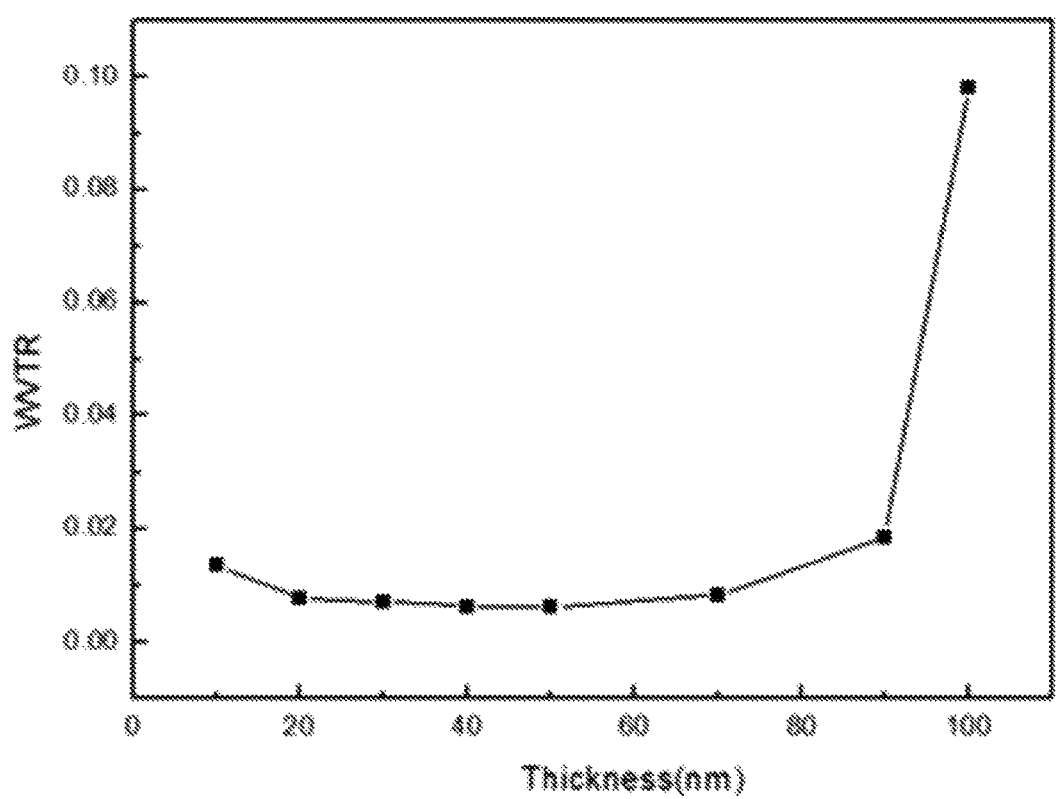
FIGS. 3A to 3E are graphs showing variation of characteristics depending on the thickness of a first insulator layer formed of an aluminum oxide based material.

As illustrated in the examples of Table 1, Table 2, and FIG. 3A, it will be appreciated that a Water Vapor Transmission Rate (WVTR) [$g/m^2$-day] may rapidly increase when the thickness of the first insulator layer 131a exceeds about 70 nm. For reference, the WVTR is a measured amount of water vapor passing through the unit area of a specimen per unit time under given temperature and humidity conditions.

Figure 3B:
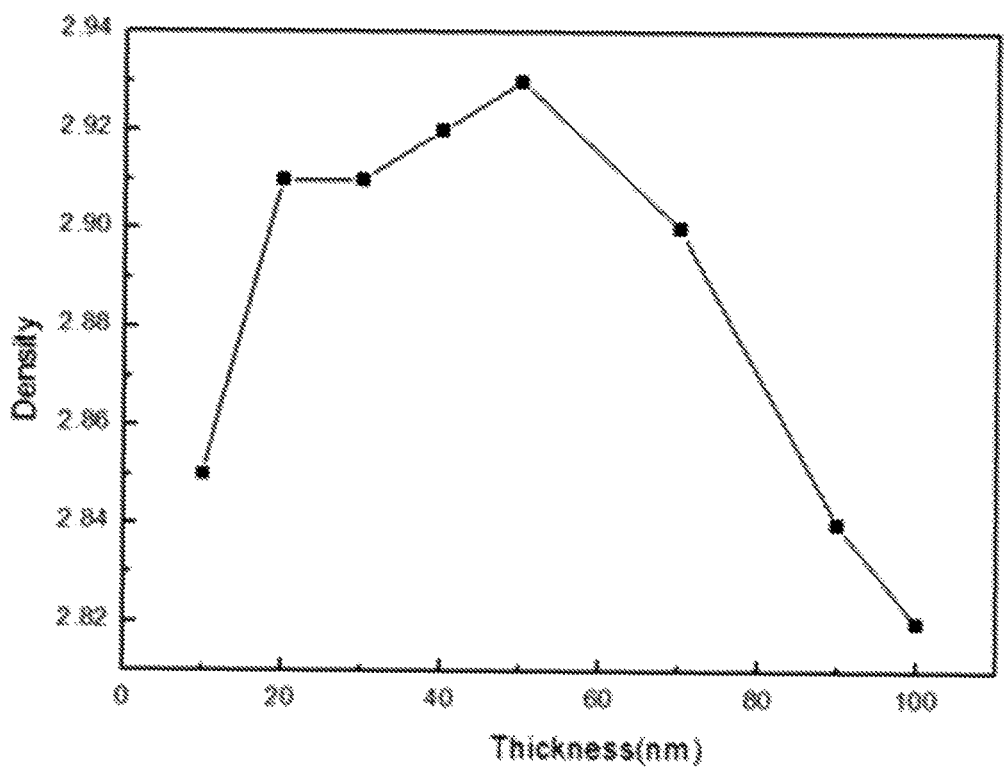

As illustrated in the examples of Table 1, Table 2, and FIG. 3B, it will be appreciated that a density [$g/m^3$] may be much less when the thickness of the first insulator layer 131a is less than about 20 nm and exceeds about 70 nm. For reference, the density indicates the density/porosity of a thin film.

Figure 3C:
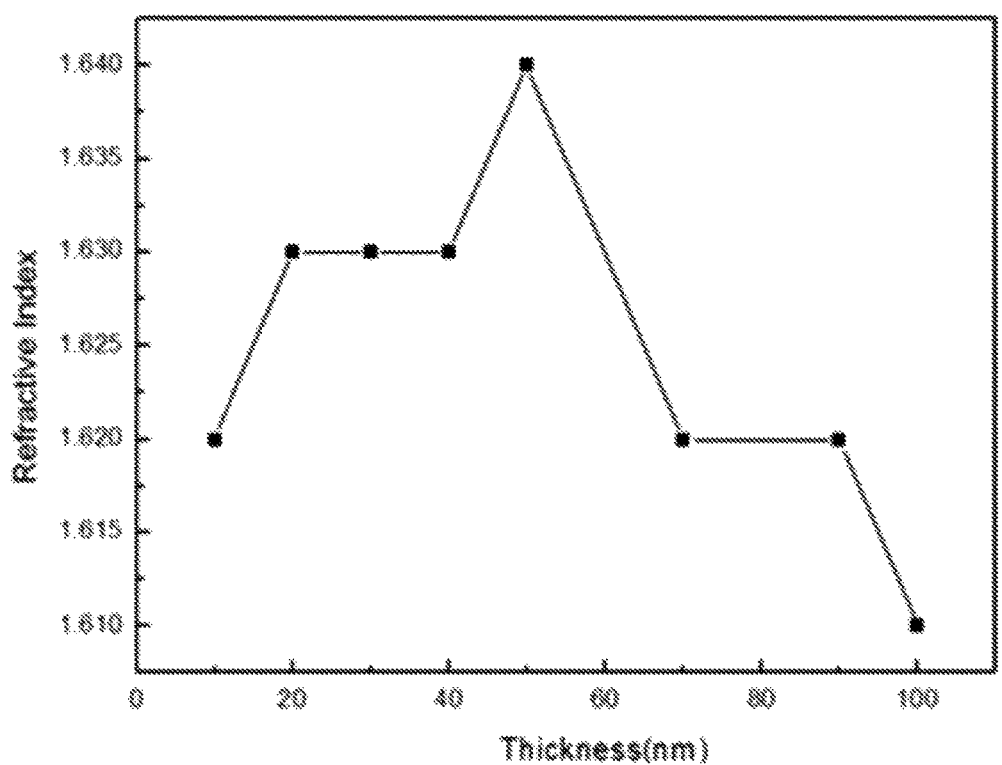

As illustrated in the examples of Table 1, Table 2, and FIG. 3C, it will be appreciated that a Refractive Index (RI) may not be within a range of 1.63~1.64 when the thickness of the first insulator layer 131a is less than about 20 nm and exceeds about 60 nm.

Figure 3D:
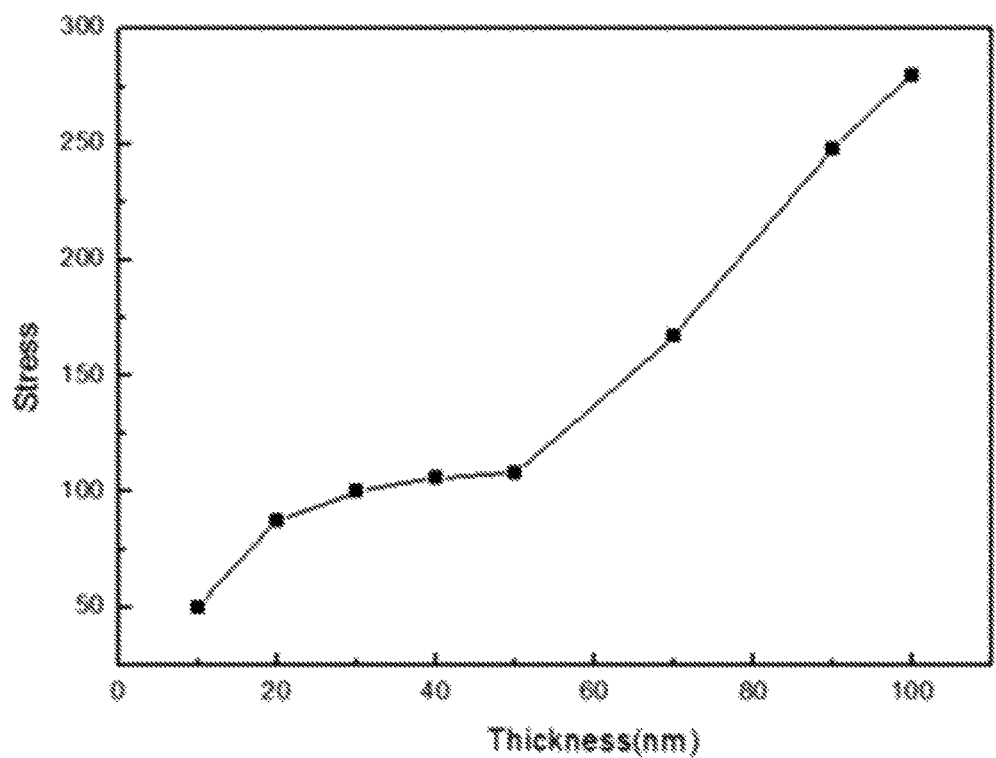

As illustrated in the examples of Table 1, Table 2, and FIG. 3D, it will be appreciated that stress [MPa] may not be 110 MPa or less, e.g., may exceed 110 MPa, when the thickness of the first insulator layer 131a exceeds about 70 nm. For reference, the stress indicates occurrence possibility of cracking or peeling at an interface between different materials.

Figure 3E:
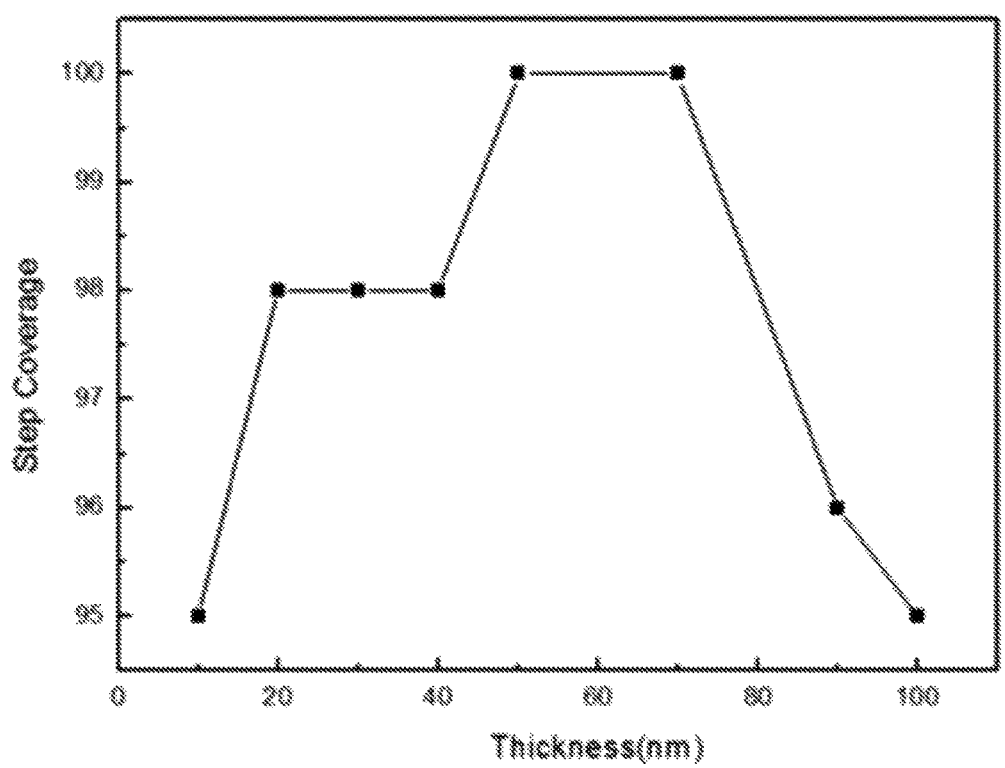

As illustrated in the examples of Table 1, Table 2, and FIG. 3E, it will be appreciated that a step coverage [%] may be 98% or less when the thickness of the first insulator layer 131a is less than about 20 nm and exceeds about 70 nm. For reference, the step coverage indicates covering uniformity with respect to an area corresponding to a given aspect ratio.

As described above, the first insulator layer 131 may have a thickness in a range of 20 nm to 50 nm in consideration of WVTR, density, refractive index, stress, and step coverage. The protective layer 131 including the first insulator layer 131a described above may have a WVTR in a range of $5\times10^{-2}$~$1\times10^{-4}$ $g/m^2$-day, a step coverage of 80% or more in an area having an aspect ratio of 0.2~52.0, a stress in a range of −200~200 MPa, and transmissivity of 97% or more for light having a wavelength in a range of 380~780 nm.

Therefore, even if the protective layer 131 has a single-layer structure including only the first insulator layer 131a, the protective layer 131 may prevent deterioration in resolution due to transfer of impurities on the light emitting array 120 to a surface of the protective layer 131, and may also sufficiently shield the light emitting array 120 from water and oxygen, which may prevent deterioration in the lifespan and reliability of the apparatus. In this way, the protective layer 131 may not require a thick organic insulator layer to compensate for the impurities on the light emitting array 120 and to prevent invasion of oxygen and water. This may be advantageous for reduction in the thickness of the apparatus.

With further reference to FIG. 2, the sealing layer 132 may be formed of a transparent film including an isotropic or phase-difference film (λ/4 film). At least one surface of the sealing layer 132 may be coated with an inorganic or organic material. The barrier layer 133 may be formed of an insulating material having adhesion and water transmission properties.

The adhesive layer 140 may be a film having transparent properties and both surfaces of which may have adhesion. The adhesive layer 140 may be adhered to the top of the light emitting array 120. The adhesive layer 140 may be formed of a transparent and insulating material which may be selected, e.g., from olefin-based, acryl-based, and silicon-based insulating materials. In particular, the adhesive layer 140 may be formed of a hydrophobic olefin-based insulating material.

When the adhesive layer 140 may be formed of a hydrophobic olefin-based insulating material, the adhesive layer 140 may have a WVTR of 10 g/m²-day or less. As such, in addition to the sealing structure 130, the adhesive layer 140 may function to prevent invasion of water and oxygen to the light emitting array 120, preventing deterioration in the lifespan and reliability of the apparatus. In addition, when the adhesive layer 140 is formed of a hydrophobic olefin-based insulating material, the adhesive layer 140 may exhibit adhesion of at least 900 gf or more.

As described above, the organic light emitting display apparatus 100 may further include the adhesive layer 140 between the light emitting array 120 and the sealing structure 130 as compared to the FIG. 1 typical organic light emitting display apparatus 10. Comparison results of characteristics between the organic light emitting display apparatus 100 and the typical light emitting display apparatus 10 are illustrated in the following Table 3. As illustrated in the following Table 3, in the typical organic light emitting apparatus (10 of FIG. 1), adhesion between the light emitting array (12 of FIG. 1) and the sealing structure (13 of FIG. 1) is less than 500 gf.

Thus, in the typical organic light emitting display apparatus 10, under a condition in which a bending radius set to 5 mm is kept for 24 hours, separation of the light emitting array (12 of FIG. 1) and the sealing structure (13 of FIG. 1) occurs, causing invasion of water and/or oxygen to the light emitting array 12, generation of impurities, and correspondingly, poor lighting. Consequently, the typical organic light emitting display apparatus 10 suffers from deterioration in the lifespan and reliability of the apparatus.

On the other hand, in the organic light emitting display apparatus 100, it can be checked that adhesion between the light emitting array 120 and the sealing structure 130 may be increased to 900 gf or more. That is, the organic light emitting display apparatus 100 may achieve at least 400 gf higher adhesion than the typical organic light emitting device 10.

Therefore, under the same conditions, in the organic light emitting display apparatus 100, the adhesive layer 140 between the light emitting array 120 and the sealing structure 130, which may achieve strong adhesion without separation, may prevent invasion of water and/or oxygen to the light emitting array 120, thus maintaining good lighting and, consequently, preventing deterioration in the lifespan and improving reliability of the apparatus.

TABLE 3

| | Typical Organic Light Emitting Display Apparatus 10 (without Adhesive Layer) | Organic Light Emitting Display Apparatus 100 (with Adhesive Layer) |
| --- | --- | --- |
| Separation | Occurred | Did Not Occur |
| Adhesion | Less than 500 gf | 900 gf or more |
| Lighting after 24 hours | Poor (occurrence of water transmission) | Good |

As described above, the organic light emitting display apparatus 100 may include the adhesive layer 140 between the light emitting array 120 and the protective layer 131. Accordingly, enhanced adhesion between the light emitting array 120 and the sealing structure 130 may prevent generation of impurities and cracking due to bending stress upon bending of the apparatus, and consequently may more firmly shield the light emitting array 120 from water and/or oxygen, which may delay deterioration in the lifespan, reliability, and resolution of the apparatus. The organic light emitting display apparatus, which may resist deterioration in lifespan, reliability, and resolution, even in a bent state thereof, may advantageously serve as a flexible display apparatus.

As shown in the example of FIG. 4, the thin film transistor array substrate 110 according to an embodiment may include gate lines GL and data lines DL crossing each other to define a plurality of pixel areas PA, and a plurality of thin film transistors TFT corresponding to the plurality of pixel areas PA.

The light emitting array 120 may include the plurality of organic light emitting devices ED, each of which may be formed in an emission area of a corresponding one of the pixel areas PA. For example, each organic light emitting device ED may be connected between a corresponding thin film transistor TFT and a reference power source Vdd, and may emit light, based on drive current corresponding to a potential difference between the thin film transistor TFT and the reference power source Vdd.

As shown in the example of FIG. 5, the thin film transistor array substrate 110 may include the support substrate 111 formed of the transparent soft material, and the plurality of thin film transistors TFT formed on the support substrate 111. The plurality of thin film transistors TFT may correspond to the plurality of pixel areas PA.

For example, the support substrate 111 may include a base layer 111a, a multi-buffer layer 111b formed on one surface of the base layer 111a to block oxygen and/or water, an optical adhesive layer 111c formed on the other surface of the base layer 111a, and a back plate 111d bonded to the other surface of the base layer 111a via the optical adhesive layer 111c. As an example, the base layer 111a may be a film formed of a polyimide based material.

The multi-buffer layer 111b may be a stack of multiple insulator layers formed of at least one material selected from among an organic insulating material and an inorganic insulating material. That is, the multi-buffer layer 111b may be a stack of two or more insulator films having at least one difference in terms of at least one of: thickness, component, and composition ratio. In one example, the multi-buffer layer 111b may be formed of $SiN_x$ or $SiO_y$. The multi-buffer layer 111b may prevent deterioration factors, such as water, oxygen, and the like, from entering the light emitting array 120 through the support substrate 111.

The optical adhesive layer 111c may be an Optical Clean Adhesive (OCA) film. The back plate 111d may be a flexible metal or plastic plate. For example, the back plate 111d may be formed of a plastic material, such as polyethersulfone (PES), polyacrylate (PAR), polyetherimide (PEI), polyethylenenaphthalate, polyethyleneterephthalate (PET), and the like. Alternatively, the back plate 111d may be formed of a metal material, such as aluminum, copper, and the like.

The thin film transistor TFT may include an active layer ACT, a gate electrode GE, a source electrode SE, and a drain electrode DE. The active layer ACT may be formed on at least a portion of a non-emission area of each pixel area PA on the support substrate 111. The active layer ACT may include a channel region, a source region ACT_S, and a drain region ACT_D at opposite sides of the channel region.

A gate insulator film 112 may be formed over the surface of the support substrate 111 to cover the active layer ACT. The gate electrode GE may be formed on the gate insulator film 112 to overlap at least the channel region of the active layer. An interlayer insulator film 113 may be formed over a surface of the gate insulator film 112 to cover the gate electrode GE.

The source electrode SE and the drain electrode DE may be spaced apart from each other on the interlayer insulator film 113. In one example, the source electrode SE may overlap at least the source region ACT_S of the active layer, and may be connected to the source region ACT_S of the active layer through a contact hole formed in the gate insulator film 112 and the interlayer insulator film 113. The drain electrode DE may overlap at least the drain region ACT_D of the active layer, and may be connected to the drain region ACT_D of the active layer through a contact hole formed in the gate insulator film 112 and the interlayer insulator film 113. The thin film transistor TFT, which may include the active layer ACT, the gate electrode GE, the source electrode SE, and the drain electrode DE, may be covered with an overcoat film 114 formed over a surface of the interlayer insulator film 113.

Each of the light emitting devices ED may include first and second electrodes EX1, EX2 facing each other, an emission layer EL interposed between the first and second electrodes EX1, EX2, and a bank BK formed in the non-emission area of each pixel area PA. The first electrode EX1 may be formed on the overcoat film 114 to correspond to the emission area of each pixel area PA, and may be connected to the thin film transistor TFT through a pixel contact hole CTH formed in the overcoat film 114. The bank BK may be formed on the overcoat film 114 to correspond to the non-emission area of each pixel area PA, and at least a portion of the bank BK may overlap the rim of the first electrode EX1. The emission layer EL may be formed on the first electrode EX1. The second electrode EX2 may be formed to face the first electrode EX1, such that the emission layer EL may be interposed between the first and second electrodes EX1, EX2.

Alternatively to the organic light emitting display apparatus 100 described above, the protective layer 131 may be a stack of multiple layers, rather than a single layer including only the first insulator layer 131a formed of aluminum oxide. In addition, alternatively to the organic light emitting display apparatus 100 described above, at least a portion of the sealing structure 130 may cover the top surface as well as the sidewall of the light emitting array 120.

FIGS. 6A to 6D are partial sectional views of organic light emitting display apparatuses according to embodiments.

Figure 6A:
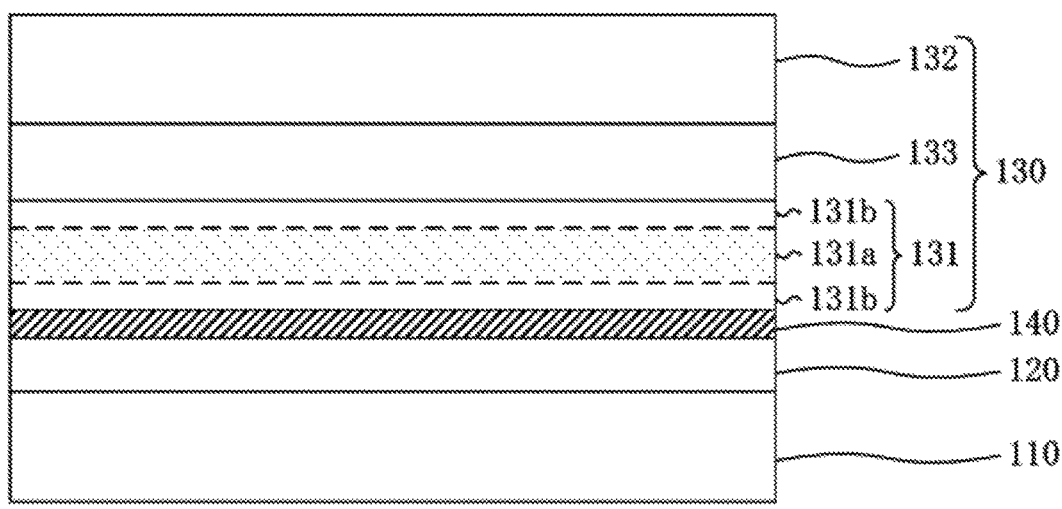
FIGS. 6A to 6D are partial sectional views of organic light emitting display apparatuses according to embodiments.

As shown in the FIG. 6A example, an organic light emitting display apparatus 100a according to an embodiment is similar to the organic light emitting display apparatus 100 shown in the FIG. 2 example, except for the protective layer 131 in a multilayered form, which may include at least one first insulator layer 131a and one or more second insulator layers 131b each formed of an inorganic insulating material or an organic-inorganic hybrid insulating material. A repeated description of similar elements will be omitted hereinafter.

For example, each of the second insulator layers 131b may be formed on an upper surface and/or a lower surface of the first insulator layer 131a. Each of the second insulator layers 131b may be formed, e.g., of any one of $SiN_x$, $SiO_y$, and $SiOC_z$.

As such, the multi-layered protective layer 131 including the first and second insulator layers 131a, 131b may achieve increased WVRT and step coverage, and thus may more effectively prevent deterioration of the light emitting array 120, and may delay deterioration in the lifespan and reliability of the apparatus.

Figure 6B:
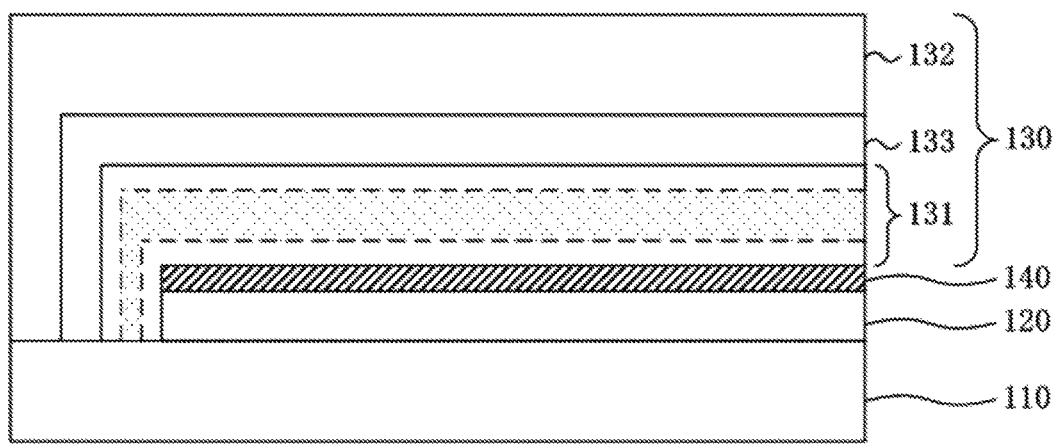

As shown in the FIG. 6B example, an organic light emitting display apparatus 100b according to an embodiment is similar to the organic light emitting display apparatus 100 shown in the FIG. 2 example, except for the sealing structure 130, which may be bonded to face the thin film transistor array substrate 110 to cover the sidewalls of the light emitting array 120 and the adhesive layer 140. A repeated description of similar elements will be omitted hereinafter.

Figure 6C:
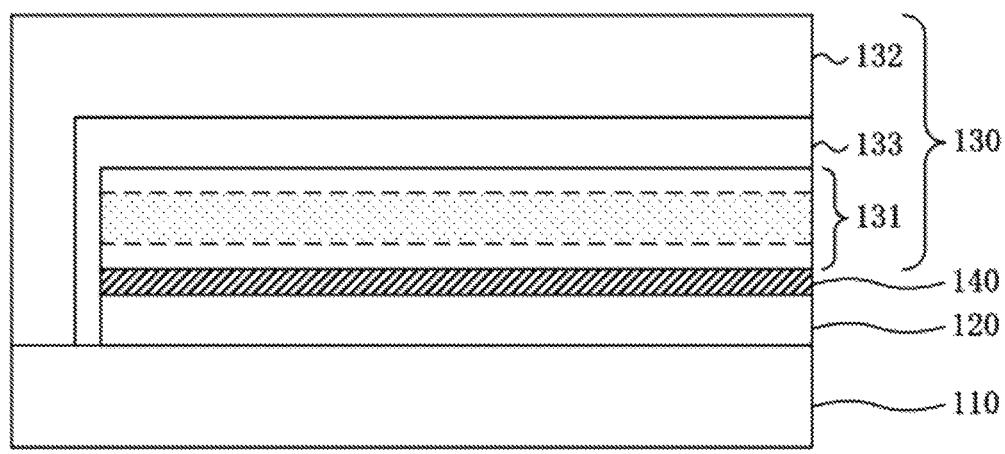

As shown in the FIG. 6C example, an organic light emitting display apparatus 100c according to an embodiment is similar to the organic light emitting display apparatus 100 shown in the FIG. 2 example, except for the sealing structure 130, which may include the protective layer 131 formed on the adhesive layer 140; and the sealing layer 132 and the barrier layer 133 bonded to face the thin film transistor array substrate 110 to cover the sidewalls of the light emitting array 120, the adhesive layer 140, and the protective layer 131. A repeated description of similar elements will be omitted.

Figure 6D:
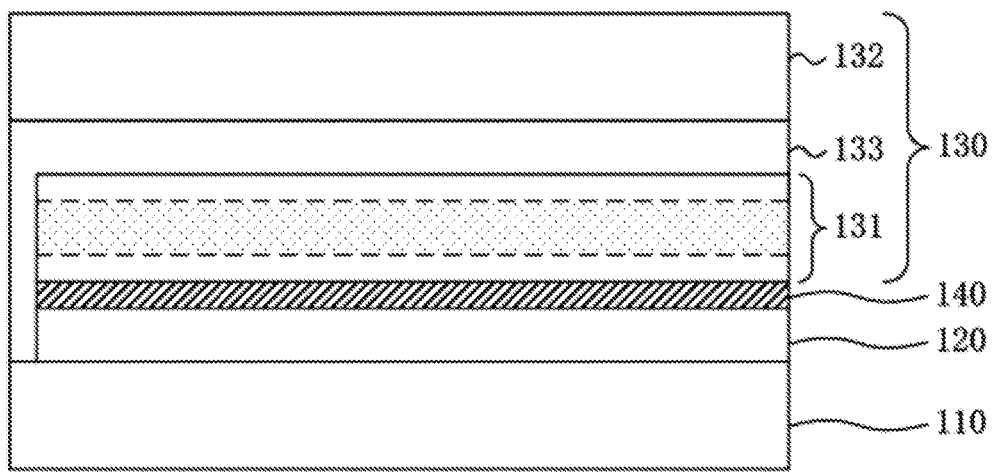

As shown in the FIG. 6D example, an organic light emitting display apparatus 100d according to an embodiment is similar to the organic light emitting display apparatus 100 shown in the FIG. 2 example, except for the sealing structure 130, which may include the protective layer 131 formed on the adhesive layer 140; the barrier layer 133 formed to cover the sidewalls of the light emitting array 120, the adhesive layer 140, and the protective layer 131; and the sealing layer 132 formed on the barrier layer 133 to face the thin film transistor array substrate 110. A repeated description of similar elements will be omitted hereinafter.

A manufacturing method of an organic light emitting display apparatus according to an embodiment will be described with reference to FIG. 7 and FIGS. 8A to 8E.

Figure 7:
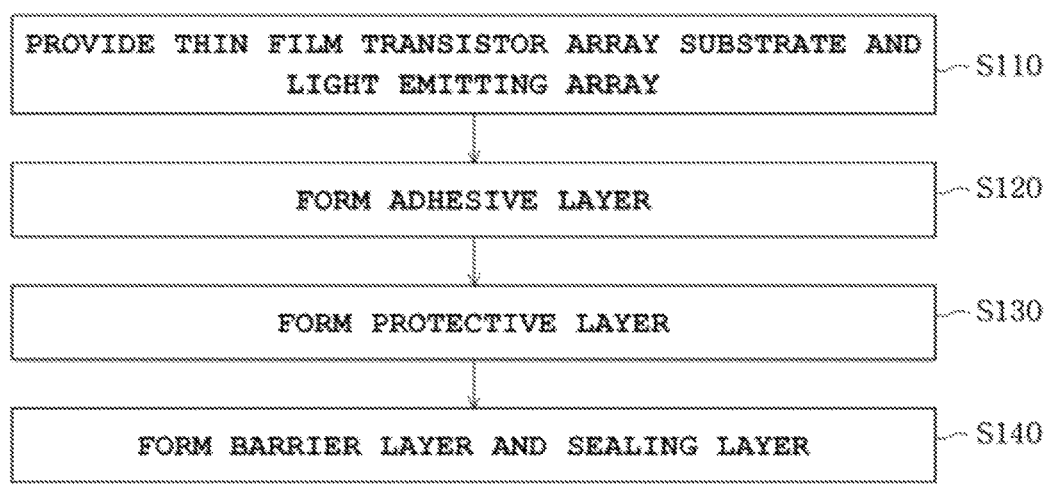
FIG. 7 is a flowchart showing a manufacturing method of an organic light emitting display apparatus according to an embodiment.

As shown in the FIG. 7 example, the manufacturing method of the organic light emitting display apparatus may include providing the thin film transistor array substrate 110 and the light emitting array 120 (S110), forming the adhesive layer 140 on the light emitting array 120 (S120), forming the protective layer 131 on the adhesive layer 140 (S130), and forming the barrier layer 133 and the sealing layer 132 on the protective layer 131 (S140).

Figure 8A:
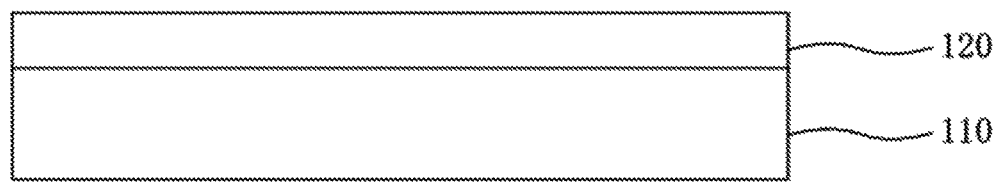
FIGS. 8A to 8E are process views showing respective operations of FIG. 7.

As shown in the FIG. 8A example, in operation S110, the plurality of thin film transistors TFT may be formed on the support substrate which may be formed of the soft material, providing the thin film transistor (TFT) array substrate 110. The plurality of thin film transistors TFT may correspond to the plurality of pixel areas. Subsequently, and also in operation S110, the plurality of organic light emitting devices ED may be formed on the thin film transistor array substrate 110, providing the light emitting array 120 including the plurality of organic light emitting devices ED. The plurality of organic light emitting devices ED may correspond to the respective pixel areas.

Figure 8B:
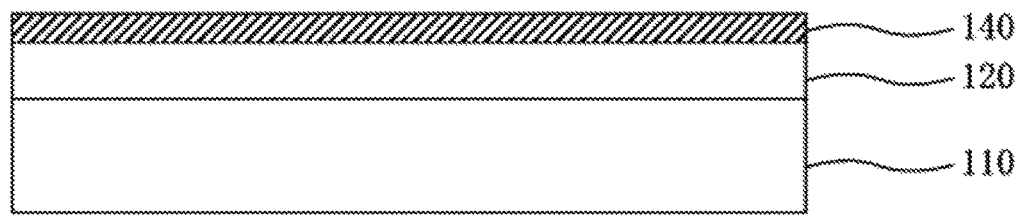

As shown in the FIG. 8B example, in operation S120, the adhesive layer 140 may be formed on the light emitting array 120. For example, the adhesive layer 140 may be formed of the transparent and insulating material which is selected from, e.g., olefin-based, acryl-based, and silicon-based materials. In one example, the adhesive layer 140 may be formed of a hydrophobic olefin-based insulating material. As such, the adhesive layer 140 may prevent deterioration in resolution and may increase adhesion to the light emitting array 120 to 900 gf or more.

Figure 8C:
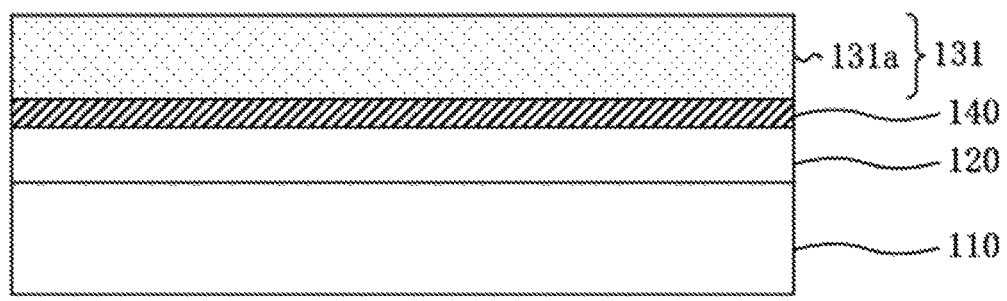

As shown in the FIG. 8C example, in operation S130, the protective layer 131 may be formed on the adhesive layer 140. The protective layer 131 may include at least one first insulator layer 131a formed of, e.g., an aluminum oxide based material. In one example, the thickness of the first insulator layer 131a may be in a range of 20 nm to 50 nm.

Figure 8D:
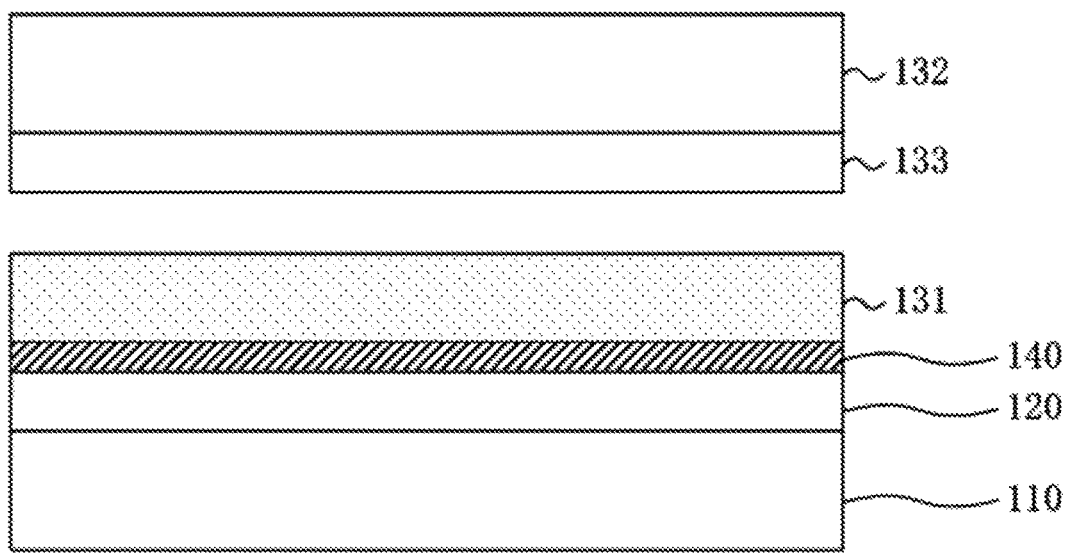
Figure 8E:
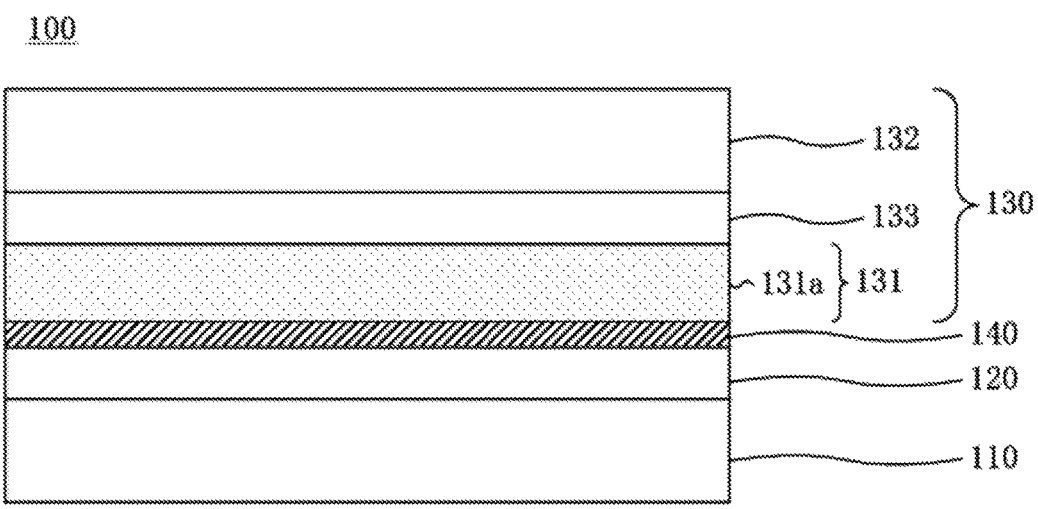

In operation S140, after providing the sealing layer 132 to which the barrier layer 133 is attached, as shown in the example of FIG. 8D, as shown in the FIG. 8E example, the barrier layer 133 may be attached to the protective layer 131 to allow the sealing layer 132 to be bonded to face the thin film transistor array 110. In this way, according to an embodiment, the organic light emitting display apparatus may be manufactured, which may advantageously serve as a flexible display apparatus.

As is apparent from the above description, an organic light emitting display apparatus according to embodiments may include an adhesive layer for adhering a light emitting array and a protective layer to each other. Through this adhesive layer, the light emitting array and the protective layer may achieve strong adhesion at an interface thereof. Accordingly, even when the organic light emitting display device is bent, separation of the light emitting array and the protective layer may not occur. In addition, there may be no impurities due to friction of the light emitting array and the protective layer separated from each other.

In addition, because the adhesive layer may compensate for impurities on the light emitting array, the transfer of impurities on the light emitting array to the protective layer may be prevented without requiring a thick insulator film formed of an organic insulating material, and consequently deterioration in resolution may be prevented. Provision of the adhesive layer, moreover, may alleviate bending stress applied to the protective layer, which may reduce cracking of the protective layer upon bending of the apparatus, and may reduce generation of impurities due to cracking.

The adhesive layer may be formed of a hydrophobic material. In this case, reliability with regard to prevention of water transmission to the light emitting array may be increased. In this way, the organic light emitting display apparatus according to embodiments may reduce cracking and generation of impurities even in a bent state thereof, and may prevent separation of the light emitting array and the protective layer, preventing deterioration in reliability and lifespan. As a result, the organic light emitting display apparatus may advantageously serve as a flexible display apparatus.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display apparatus, comprising:
   a thin film transistor array substrate comprising:
   a flexible support substrate comprising a flexible material; and
   a plurality of thin film transistors on the flexible support substrate and the plurality of thin film transistors corresponding to a plurality of pixel areas;
   a light emitting array comprising a plurality of organic light emitting devices on the thin film transistor array substrate and corresponding to the plurality of pixel areas;
   a sealing structure over the thin film transistor array substrate, such that the light emitting array is interposed between the thin film transistor array substrate and the sealing structure; and
   an adhesive layer between the light emitting array and the sealing structure, such that the light emitting array and the sealing structure are adhered to each other by the adhesive layer, wherein the adhesive layer is hydrophobic,
   wherein the sealing structure includes:
   a protective layer over the adhesive layer;
   a sealing layer over the thin film transistor array substrate; and
   a barrier layer bonding the protective layer and the sealing layer to each other, wherein the barrier layer is formed of an insulating material having adhesion and water transmission properties, and
   wherein the barrier layer covers a sidewall of the light emitting array and directly contacts the flexible support substrate.

2. The apparatus according to claim 1, wherein the adhesive layer comprises a transparent and insulating material selected from one or more of: olefin-based, acryl-based, and silicon-based insulating materials.

3. The apparatus according to claim 2, wherein the adhesive layer comprises the olefin-based insulating material having hydrophobic and adhesive properties.

4. The apparatus according to claim 2, wherein:
   the adhesive layer comprises a film having adhesive surfaces on both sides; and
   the adhesive layer bonds the light emitting array and the sealing structure to increase adhesion between the light emitting array and the sealing structure.

5. The apparatus according to claim 1, wherein the protective layer comprises a first insulator layer comprising an aluminum oxide-based material.

6. The apparatus according to claim 5, wherein the first insulator layer has a thickness in a range of 20 nm-50 nm.

7. The apparatus according to claim 5, wherein the protective layer comprises:
   at least one first insulator layer; and
   at least one second insulator layer on an upper surface or a lower surface of the first insulator layer, the second insulator layer comprising any one or more of: $SiN_x$, $SiO_y$, and $SiOC_z$.

8. The apparatus according to claim 1, wherein each of the protective layer, the sealing layer, and the barrier layer covers the sidewall of the light emitting array and directly contacts the flexible support substrate.

9. A manufacturing method of an organic light emitting display apparatus, the method comprising:
   providing a thin film transistor array substrate and a light emitting array, the thin film transistor array substrate comprising a flexible support substrate and a plurality of thin film transistors on the flexible support substrate, the flexible support substrate comprising a flexible material, the plurality of thin film transistors corresponding to a plurality of pixel areas, the light emitting array comprising a plurality of organic light emitting devices on the thin film transistor array substrate, the plurality of organic light emitting devices corresponding to the plurality of pixel areas;
   providing a protective layer, the protective layer comprising a first insulator layer, the first insulator layer comprising aluminum oxide;

aligning a sealing layer on the protective layer, such that the sealing layer is over the thin film transistor array substrate; and providing an adhesive layer between the light emitting array and the sealing structure, such that the light emitting array and the sealing structure are adhered to each other by the adhesive layer, wherein the adhesive layer is hydrophobic, attaching the sealing layer to the protective layer using a barrier layer between the sealing layer and the protective layer, wherein both surfaces of the adhesive layer are adhesive surfaces, such that the light emitting array and the protective layer are bonded by the adhesive layer, thereby increasing adhesion between the light emitting array and the protective layer, wherein the barrier layer is formed of an insulating material having adhesion and water transmission properties, and wherein the barrier layer covers a sidewall of the light emitting array and directly contacts the flexible support substrate.

10. The method according to claim 9, wherein the adhesive layer comprises a transparent and insulating material selected from one or more of: olefin-based, acryl-based, and silicon-based insulating materials.

11. The method according to claim 10, wherein the adhesive layer comprises the olefin-based insulating material having hydrophobic and adhesive properties.

12. The method according to claim 9, wherein the first insulator layer has a thickness in a range of 20 nm~50 nm.

13. The method according to claim 9, wherein the protective layer comprises:

at least one first insulator layer; and at least one second insulator layer formed on an upper surface or a lower surface of the first insulator layer, the second insulator layer comprising any one or more of: $SiN_x$, $SiO_y$, and $SiOC_z$.

14. The apparatus according to claim 1, wherein the protective layer comprises an aluminum oxide-based material.

15. The apparatus according to claim 1, wherein the barrier layer is transparent.

16. The apparatus according to claim 1, wherein the plurality of organic light emitting devices include active areas that emit light, and the barrier layer covers the active areas that emit light.

17. The apparatus according to claim 1, wherein the barrier layer covers sides of the plurality of light emitting arrays to encapsulate the plurality of light emitting arrays.

18. The apparatus according to claim 1, wherein the protective layer is between the barrier layer and the adhesive layer.

19. The method according to claim 9, wherein each of the protective layer, the sealing layer, and the barrier layer covers the sidewall of the light emitting array and directly contacts the flexible support substrate.

* * * * *